(12) United States Patent
Rostovtsev et al.

(10) Patent No.: US 8,038,853 B2
(45) Date of Patent: Oct. 18, 2011

(54) PHOTO-INDUCED REDUCTION-OXIDATION CHEMISTRY OF CARBON NANOTUBES

(75) Inventors: Vsevolod Rostovtsev, Swarthmore, PA (US); Ming Zheng, Wilmington, DE (US)

(73) Assignee: E.I. du Pont de Nemours and Company, Wilimington, DE (US)

( * ) Notice: Subject to any disclaimer, the term of this patent is extended or adjusted under 35 U.S.C. 154(b) by 1156 days.

(21) Appl. No.: 11/764,334

(22) Filed: Jun. 18, 2007

(65) Prior Publication Data
US 2008/0308407 A1    Dec. 18, 2008

(51) Int. Cl.
*C25B 9/00* (2006.01)
(52) U.S. Cl. .............. 204/242; 205/637; 204/157.52
(58) Field of Classification Search .......... 205/637; 204/242, 157.52
See application file for complete search history.

(56) References Cited

U.S. PATENT DOCUMENTS

| | | | |
|---|---|---|---|
| 5,112,974 A * | 5/1992 | Barton | 546/4 |
| 5,350,644 A | 9/1994 | Graetzel et al. | |
| 5,441,827 A | 8/1995 | Gratzel et al. | |
| 5,698,175 A * | 12/1997 | Hiura et al. | 423/447.1 |
| 5,728,487 A | 3/1998 | Gratzel et al. | |
| 6,160,140 A * | 12/2000 | Bhaggan et al. | 554/126 |
| 6,916,576 B2 * | 7/2005 | Sotomura | 429/105 |
| 2005/0166960 A1 | 8/2005 | Jin et al. | |
| 2007/0137701 A1 | 6/2007 | Sainte Catherine et al. | |
| 2007/0137998 A1 * | 6/2007 | Sykora et al. | 204/157.15 |
| 2010/0004468 A1 * | 1/2010 | Wong et al. | 549/208 |

FOREIGN PATENT DOCUMENTS

| | | |
|---|---|---|
| DE | 101 18 200 A1 | 10/2002 |
| EP | 1 653 549 A1 | 5/2006 |
| JP | 2004082663 A * | 3/2004 |
| WO | WO 2004/112163 A1 | 12/2004 |
| WO | WO 2007/001402 A2 | 1/2007 |

OTHER PUBLICATIONS

U.S. Appl. No. 11/241,515, filed Sep. 30, 2005, Salah Boussaad et al.
Collins et al., Extreme Oxygen Sensitivity of Electronic Properties of Carbon Nanotubes, Science, 2000, vol. 287:1807-1804.
Kong et al., Nanotube Molecular Wires as Chemical Sensors, Science, 2000, vol. 287:622-625.
Britto et al., Improved Charge Transfer at Carbon Nanotube Electrodes, Advanced Materials, 1999, vol. 11:154-157.
Luo et al., Investigation of the Electrochemical and Electrocatalytic Behavior of Single-Wall Carbon Nanotube Film on a Glassy Carbon Electrode, Anal. Chem., 2001, vol. 73:915-920.
Zhang et al., Electrochemical Behavior of Multi-Wall Carbon Nanotubes and Electrocatalysis of Toluene-Filled Nanotube Film on Gold Electrode, Electrochimica ACTA, 2003, vol. 49:715-719.
Larrimore et al., Probing Electrostatic Potentials in Solution With Carbon Nanotube Transistors, Nano Letters, 2006, vol. 6:1329-1333.
Kymakis et al., Photovoltaic Cells Based on Dye-Sensitisation of Single-Wall Carbon Nanotubes in a Polymer Matrix, Solar Energy Materials and Solar Cells, 2003, vol. 80:465-472.

(Continued)

*Primary Examiner* — Alexa D. Neckel
*Assistant Examiner* — Nicholas A. Smith

(57) ABSTRACT

Described herein is a method for the photo-induced reduction/oxidation of carbon nanotubes, and their use in photochemical cells and in electrochemical cells for the generation of hydrogen.

18 Claims, 3 Drawing Sheets

OTHER PUBLICATIONS

Liu et al., Carbon-Nanotube-Enhanced Direct Electron-Transfer Reactivity of Hemoglobin Immobilized on Polyurethane Elastomer Film, Journal Physical Chemistry B, 2007, vol. 111:1182-1188.

Zhao et al., A Reagentless Biosensor of Nitric Oxide Based on Direct Electron Transfer Process of Cytochrome C on Multi-Walled Carbon Nanotube, Frontiers in Bioscience, 2005, vol. 10:2005-2010.

* cited by examiner

PHOTO-INDUCED REDUCTION-OXIDATION CHEMISTRY OF CARBON NANOTUBES

FIELD OF INVENTION

Described herein is a method for the photo-induced reduction/oxidation of carbon nanotubes, and their use in photochemical cells and in electrochemical cells for the generation of hydrogen.

BACKGROUND OF THE INVENTION

The need for nanodevices in electronic components is increasing logarithmically. One particular need is for small, reliable energy sources to drive these components. One such device is a photoelectrochemical cell.

A photoelectrochemical cell is one where an electrical potential is generated between two electrodes by the action of light on an electrolyte. The efficiency of such a device can be high compared to conventional silicon photocells using semiconductors. Most photoelectrochemical cells use a transition metal complex, often called "dyes", along with a metal oxide particle, such as those described in U.S. Pat. Nos. 5,350,644, 5,441,827 and 5,728,487. The efficiency can be even further increased by using the unique electronic properties of CNTs in place of the metal oxide particle.

Carbon nanotubes (CNT) have been the subject of intense research since their discovery in 1991. CNTs possess unique properties such as small size, considerable stiffness, and electrical conductivity, which makes them suitable in a wide range of applications, including use as structural materials and in molecular electronics, nanoelectronic components, and field emission displays. Carbon nanotubes (CNTs) are rolled up graphene sheets having a diameter on the nanometer scale and typical lengths of up to several micrometers. CNTs can behave as semiconductors or metals depending on their chirality. Additionally, dissimilar carbon nanotubes may contact each other allowing the formation of a conductive path with interesting electrical, magnetic, nonlinear optical, thermal and mechanical properties. Carbon nanotubes may be either multi-walled (MWNTS) or single-walled (SWNTs), and have diameters in the nanometer range.

It is known that single walled carbon nanotubes are sensitive to their chemical environment, specifically that exposure to air or oxygen alters their electrical properties (Collins et al. (2000) *Science* 287:1801). Additionally, exposure of CNTs to gas molecules such as $NO_2$ or $NH_3$ alters their electrical properties (Kong et al. (2000) *Science* 287:622). Thus chemical gas sensors can be designed, based on how they influence the electrical properties of carbon nanotubes such as described in DE10118200.

Carbon nanotubes have been used in electrocatalysis. Microelectrodes, constructed of multiwalled carbon nanotubes, were shown to provide a catalytic surface for electrochemical reduction of dissolved oxygen, potentially useful in fuel cell applications (Britto et al. (1999) *Advanced Materials* 11:154). A film of single walled carbon nanotubes functionalized with carboxylic acid groups on a glassy carbon electrode showed electrocatalytic behavior with several redox active biomolecules, involving reduction of the carboxylic acid groups (Luo et al. (2001) *Anal. Chem.* 73:915). Toluene-filled multiwalled carbon nanotubes as a film on a gold electrode surface were shown to respond better to electroactive biomolecules than empty carbon nanotubes (Zhang et al. (2003) *Electrochimica Acta* 49:715).

The ability to alter the electrochemical characteristics of carbon nanotubes suggests applications involving redox reactions. For example, Larrimore et al (*Nano Letters* (2006), 6(7), 1329-1333) teach the use of single-walled carbon nanotube transistors to measure changes in the chemical potential of a solution due to redox-active transition-metal complexes. Similarly WO 2004112163 (Sainte et al.,) teach photovoltaic cells comprised of carbon nanotubes (single-walled or multiple-walled), conjugated polymers, and at least one organic pigment or dye. Specifically, the photovoltaic cell consists of one or more conjugated polymers, which function as an electron donor, and the carbon nanotubes containing the pigment or dye, which functions as the electron acceptor. Commonly owned and copending U.S. Ser. No. 11/241,515 teaches that changes in the redox potential of a solution will produce alterations in the electrochemical properties of a carbon nanotube that may be quantified for analyte detection.

The ability to use carbon nanotubes as elements in redox reactions makes them ideal for photocell applications. A need exists therefore for small photocells that operate on the basis of redox reactions. Applicants have solved the stated problem via the development of a photochemical cell that comprises a photochemical system comprising a transition metal complex in association with a population of carbon nanotubes and an electron acceptor. In the presence of light the system functions to generate an electron flow to the electron acceptor for energy production.

SUMMARY OF THE INVENTION

The invention relates to a photochemical system comprising a transition metal complex the is responsive to light within a specified absorption wavelength band in association with a population of carbon nanotubes and an electron acceptor. Activation of the transition metal complex by light generates a flow of electrons that are transmitted to the carbon nanotubes and on to the electron acceptor. The photochemical system may be unused in the context of a photochemical cell for the generation of hydrogen gas.

Accordingly the invention provides a photochemical system comprising:

a) a transition metal complex which absorbs light over an absorption band range of between 300 and 600 nm and has an extinction coefficient of at least about 10 $M^{-1}$ $cm^{-1}$;
   b) a population of carbon nanotubes dispersed in an aqueous medium;
   c) an electron acceptor; and
   d) light emitted at the wavelength of the absorption band range of the transition metal complex.

In another embodiment the invention provides a photochemical cell comprising:

a) an anode;
   b) a cathode; and
   c) an electrolyte comprising:
      i) a transition metal complex having an absorption band with a maximum between 300 and 600 nm and an extinction coefficient more than about 10 $M^{-1}$ $cm^{-1}$; and
      ii) a population of carbon nanotubes dispersed in an aqueous containing medium.

In an alternate embodiment the invention provides A method for the oxidation of a carbon nanotube comprising:

a) providing a set of redox reactants in close association with each other, the reactants consisting essentially of:
      i) a transition metal complex having an absorption band with a maximum between 300 and 600 nm and an extinction coefficient more than about 10 $M^{-1}$ $cm^{-1}$;

ii) a population of carbon nanotubes dispersed in an aqueous containing medium; and
iii) an electron acceptor;
b) irradiating the redox reactants of (a) with light comprising the wavelength of the absorption band of the transition metal complex whereby the carbon nanotubes in the redox reactants are oxidized; and
c) optionally recovering the oxidized carbon nanotubes.

In an additional embodiment the invention provides an apparatus to generate hydrogen, comprising:
a) an anode;
b) a cathode; and
c) an electrolyte comprising:
i) a transition metal complex having an absorption band with a maximum between 300 and 600 nm and an extinction coefficient more than about $10 \text{ M}^{-1} \text{ cm}^{-1}$;
ii) a population of carbon nanotubes dispersed in an aqueous containing medium at acidic pH; and
iii) an electron donor.

In another embodiment the invention provides a method for the generation of hydrogen comprising:
a) providing a set of oxidation reactants in close association with each other, the reactants consisting essentially of:
i) a transition metal complex having an absorption band with a maximum between 300 and 600 nm and an extinction coefficient more than about $10 \text{ M}^{-1} \text{ cm}^{-1}$;
ii) a population of carbon nanotubes dispersed in an aqueous containing medium at an acidic pH; and
iii) an electron donor;
b) irradiating the oxidation reactants of (a) with light comprising the wavelength of the absorption band of the transition metal complex whereby hydrogen is produced; and
c) optionally recovering the hydrogen.

DETAILED DESCRIPTION

Figure 1:
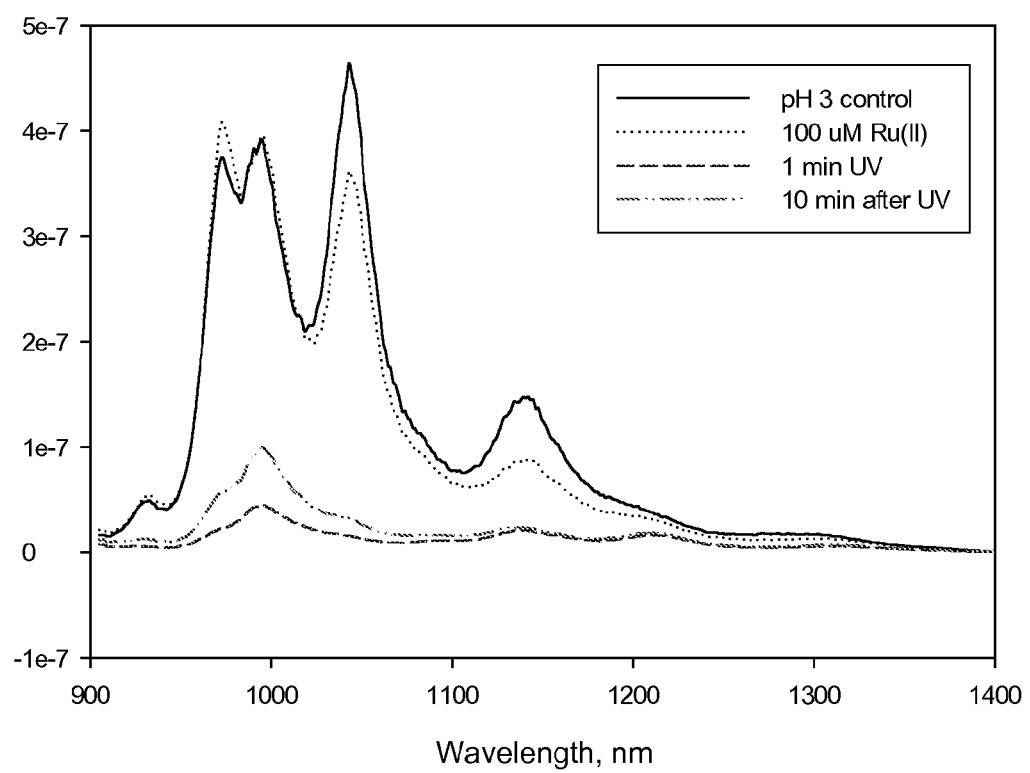
FIG. 1 is a graph showing the change in fluorescence intensity after irradiation with UV of the 10 μM Ru(bipy)$_3$Cl$_2$ DNA/CNT hybrid at pH 3.

Described herein is a photoelectrochemical system comprising: a) a transition metal complex having an absorption band with a maximum between 300 and 600 nm and an extinction coefficient of at least about $10 \text{ M}^{-1} \text{ cm}^{-1}$; b) a population of carbon nanotubes dispersed in an aqueous containing medium; c) an electron acceptor; and d) light comprising the wavelength of the absorption band of the transition metal complex. Such a system is useful in devices and systems used for the conversion of light energy into electricity or chemical fuels.

"Transition metal complex" refers to a compound formed by the union of a transition metal with a non-metallic ion or molecule called a ligand or complexing agent.

Suitable transition metal complexes should have an absorption band with a maximum between 300-600 nm, and an extinction coefficient of about at least $10 \text{ M}^{-1} \text{ cm}^{-1}$. Typically, they would have an extinction coefficient in the range of about 10 to about $10^6 \text{ M}^{-1} \text{ cm}^{-1}$.

In one embodiment the transition metal in the complex is Ru, Os or Fe and ligands in the complex are bidentate, tridentate, or polydentate polypyridyl compounds, which may be unsubstituted or substituted. In another embodiment one or more of these pyridyl compounds contain at least one cyano group, in particular comprising a mononuclear, cyano-containing pyridyl compound.

In another embodiment there are three ruthenium atoms and six donating atoms per complex in a photosensitizing dye according to the invention.

Also suitable are compounds of the formulas shown below:

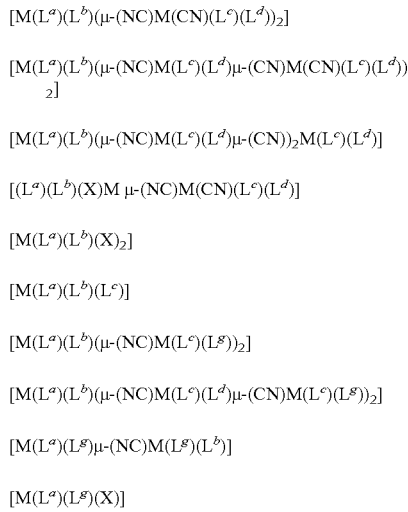

$[M(L^a)(L^b)(\mu\text{-}(NC)M(CN)(L^c)(L^d))_2]$ $[M(L^a)(L^b)(\mu\text{-}(NC)M(L^c)(L^d)\mu\text{-}(CN)M(CN)(L^c)(L^d))_2]$ $[M(L^a)(L^b)(\mu\text{-}(NC)M(L^c)(L^d)\mu\text{-}(CN))_2M(L^c)(L^d)]$ $[(L^a)(L^b)(X)M\,\mu\text{-}(NC)M(CN)(L^c)(L^d)]$ $[M(L^a)(L^b)(X)_2]$ $[M(L^a)(L^b)(L^c)]$ $[M(L^a)(L^b)(\mu\text{-}(NC)M(L^c)(L^g))_2]$ $[M(L^a)(L^b)(\mu\text{-}(NC)M(L^c)(L^d)\mu\text{-}(CN)M(L^c)(L^g))_2]$ $[M(L^a)(L^g)\mu\text{-}(NC)M(L^g)(L^b)]$ $[M(L^a)(L^g)(X)]$ in which each M is independently selected from ruthenium, osmium, or iron; μ-(CN) or μ-(NC) indicates that the cyano group bridges two metal atoms;

each $L^a$, $L^b$, $L^c$, and $L^d$ independently is selected from 2,2'-bipyridyl, unsubstituted or substituted by one or two COOH groups; 2,2'bipyridyl substituted by one or two groups selected from $C_{1-16}$ alkyl, $C_{1-16}$ alkoxy and diphenyl; 2,2'-biquinoline unsubstituted or substituted by one or two carboxy groups; phenanthroline, unsubstituted or substituted by one or two carboxy groups and/or one or two hydroxy groups, and/or one or two oxime groups; 4,7 diphenyl-1,10-phenanthroline disulfonic acid; diazatriphenylene, diaza-hydroxy-carboxyl-triphenylene (for example 1,12 diazatriphenylene or 1,12 diaza (6-hydroxy-7-carboxy)triphenylene); carboxy pyridine-(for example 2-carboxypyridine); phenyl pyridine; 2,2'-Bis(diphenylphosphino) 1,1'-binaphthalene; (pyridyl azo) resorcinol (for example 4-(2-pyridyl(azo) resorcinol); bis(2-pyridyl) $C_{1-4}$ alkane; N,N,N',N'-tetra $C_{1-4}$ alkyl ethylene diamine; and di-$C_{1-4}$ alkyl glyoxime; 2,2'-biimidazole; 2,2'-bibenzimidazole; 2,-(2'-pyridyl)-N-methylbenzimidazole; 2,-(2'-pyridyl)benzothiozole; 2,-(2'-pyridylmethyl)benzimidazole;

$L^g$ is selected from terpyridyl, (unsubstituted or substituted by phenyl, which phenyl group is unsubstituted or substituted by COOH)(for example 2, 2',6',2" terpyridine) and dicarboxy-pyridine (for example 2,6-dicarboxy-pyridine); 2,6-bis(benzimidazole-2'-yl)pyridine; 2,6-bis(N-methylbenzimidazole-2'-yl)pyridine; 2,6-bis(benzothiazol-2'-yl)pyridine.

Each X independently is halide, H$_2$O, CN—, NCS—, amine (primary or secondary alkylamine) and/or pyridine.

In one embodiment one of $L^a$ and $L^b$ has an interlocking group selected as defined above, for example a —COOH, and/or an OH, and/or an =N—OH, and/or —CO—NH$_2$ group.

The terpyridyl when substituted can be substituted by $C_{1-4}$ alkyl (preferably methyl) and/or $C_{1-16}$ alkoxy (preferably methoxy) and/or carboxy on one or more of the pyridyl groups—for example 2,2',6', 2" terpyridine.

The phenanthroline in a $L^a$ to $L^d$ can be selected from 5-carboxy-6-hydroxy-1,10-phenanthroline and 5,6-dioxime-10-phenanthroline.

The diaza hydroxy carboxyl triphenylene in $L^a$ to $L^d$ can be 1,12-diaza-6-hydroxy-7-carboxyl triphenylene.

The $C_{1-16}$ alkyl-2,2'bipyridyl in $L^a$ to $L^d$ can be 4-$C_{1-16}$ alkyl-2,2'bipyridyl.

The carboxy pyridine in $L^a$ to $L^d$ can be 2-carboxypyridine.

The (pyridyl azo) resorcinol in $L^a$ to $L^d$ can be 4-(2-pyridyl azo) resorcinol.

The term "light" refers to electromagnetic radiation, such as but not limited to visible, ultraviolet, near-ultraviolet, infrared, and/or near-infrared wavelengths. It can be a single wavelength, a continuum, or mixture of wavelengths. The source of the light can be any natural or artificial source that produces the required wavelength(s).

By "aqueous containing medium" it is meant that the medium comprises at least 50% water by weight. The medium can be a mixture of water and an organic solvent or can be a mixture of water with more than one organic solvent. The choice of medium is not critical provided the medium is not detrimental to the nanotubes or other reaction components. The medium can optionally contain dispersants, buffers, salts, and/or chelators, and can be a solution, a gel or a film. Suitable aqueous containing media include, but are not limited to, water, solutions of surfactants in water, aqueous gels, and wetted films. Another suitable medium is a film or a thin layer on top of a supporting surface that contains a significant amount of water, which may be physisorbed, or be present as a part of a gel or hydration envelope.

The term "carbon nanotube" refers to a hollow article composed primarily of carbon atoms. The carbon nanotube can be doped with other elements, e.g., metals. Carbon nanotubes are generally about 0.5-2 nm in diameter where the ratio of the length dimension to the narrow dimension, i.e., the aspect ratio, is at least 5. In general, the aspect ratio is between 10 and 2000. The carbon-based nanotubes of the invention can be either multi-walled nanotubes (MWNTs) or single-walled nanotubes (SWNTs). A MWNT, for example, includes several concentric nanotubes each having a different diameter. Thus, the smallest diameter tube is encapsulated by a larger diameter tube, which in turn, is encapsulated by another larger diameter nanotube. A SWNT, on the other hand, includes only one nanotube. In one embodiment only SWNTs are used.

Carbon nanotubes (CNT) may be produced by a variety of methods, and additionally are commercially available. Methods of CNT synthesis include laser vaporization of graphite (A. Thess et al. Science 273, 483 (1996)), arc discharge (C. Journet et al., Nature 388, 756 (1997)) and HiPC® (high pressure carbon monoxide) process (P. Nikolaev et al. Chem. Phys. Lett. 313, 91-97 (1999)). Chemical vapor deposition (CVD) can also be used in producing carbon nanotubes (J. Kong et al. Chem. Phys. Lett. 292, 567-574 (1998). Additionally CNT's may be grown via catalytic processes both in solution and on solid substrates (Yan Li, et al., Chem. Mater.; 2001; 13(3); 1008-1014); (N. Franklin and H. Dai Adv. Mater. 12, 890 (2000); A. Cassell et al. J. Am. Chem. Soc. 121, 7975-7976 (1999)).

The population of carbon nanotubes is dispersed in the aqueous containing medium. This is typically done with the addition of a dispersant.

Dispersants are well-known in the art and a general description can be found in "Disperse Systems and Dispersants", Rudolf Heusch, Ullmann's Encyclopedia of Industrial Chemistry, DOI: 10.1002/14356007.a08_577. The invention provides carbon nanotubes that are dispersed in solution, preferably singly dispersed. A number of dispersants may be used for this purpose wherein the dispersant is associated with the carbon nanotube by covalent or non-covalent means. The dispersant should preferably substantially cover the length of the nanotube, preferably at least half of the length of the nanotube, more preferably substantially all of the length. The dispersant can be associated in a periodic manner with the nanotube, such as wrapping. Preferred dispersants of the invention are charged dispersants. The term "charged dispersant" means an ionic compound that can function as a dispersant or surfactant. The charged dispersant can be anionic or cationic, and can be a single compound or polymeric.

Examples of polymers that could be suitable for the present invention include but are not limited to those described in M. O'Connell et al., Chem. Phys. Lett., 342, 265, 2001 and WO 02/076888.

In a preferred embodiment the dispersant will be a bio-polymer. Bio-polymers particularly suited for the invention include those described in commonly owned and co-pending U.S. Ser. No. 10/716,346 herein incorporated in entirely by reference.

Bio-polymers include those comprised of nucleic acids and polypeptides. As used herein a "nucleic acid molecule" is defined as a polymer of RNA, DNA, or peptide nucleic acid (PNA) that is single- or double-stranded, optionally containing synthetic, non-natural or altered nucleotide bases. A nucleic acid molecule in the form of a polymer of DNA may be comprised of one or more segments of cDNA, genomic DNA or synthetic DNA.

The letters "A", "G", "T", "C" when referred to in the context of nucleic acids will mean the purine bases adenine ($C_5H_5N_5$) and guanine ($C_5H_5N_5O$) and the pyrimidine bases thymine ($C_5H_6N_2O_2$) and cytosine ($C_4H_5N_3O$), respectively.

Polypeptides may be suitable as dispersants in the present invention if they have suitable charge and length to sufficiently disperse the nanotubes. Bio-polymers particularly well suited for singly dispersing carbon nanotubes are those comprising nucleic acid molecules. Nucleic acid molecules of the invention may be of any type and from any suitable source and include but are not limited to DNA, RNA and peptide nucleic acids. The nucleic acid molecules may be either single stranded or double stranded and may optionally be functionalized at any point with a variety of reactive groups, ligands or agents. The nucleic acid molecules of the invention may be generated by synthetic means or may be isolated from nature by protocols well known in the art (Sambrook, J., Fritsch, E. F. and Maniatis, T., Molecular Cloning: A Laboratory Manual, Cold Spring Harbor Laboratory Press, Cold Spring Harbor, N.Y., 1989).

It should be noted that functionalization of the nucleic acids are not necessary for their association with CNT's for the purpose of dispersion. Functionalization may be of interest after the CNT's have been dispersed and it is desired to bind other moieties to the nucleic acid or immobilize the carbon nanotube-nucleic acid complex to a surface through various functionalized elements of the nucleic acid. As used herein nucleic acids that are used for dispersion, typically lack functional groups and are referred to herein as "unfunctionalized".

Peptide nucleic acids (PNA) are particularly useful in the present invention, as they possess the double functionality of both nucleic acids and peptides. Methods for the synthesis and use of PNA's are well known in the art, see for example Antsypovitch, S. I. Peptide nucleic acids: structure Russian Chemical Reviews (2002), 71(1), 71-83.

The nucleic acid molecules used as dispersants may have any composition of bases and may even consist of stretches of the same base (poly A or polyT for example) without impairing the ability of the nucleic acid molecule to disperse the bundled nanotube. Preferably the nucleic acid molecules will be less than about 2000 bases where less than 1000 bases is preferred and where from about 5 bases to about 1000 bases is most preferred. Generally the ability of nucleic acids to disperse carbon nanotubes appears to be independent of sequence or base composition, however there is some evidence to suggest that the less G-C and T-A base-pairing interactions in a sequence, the higher the dispersion efficiency, and that RNA and varieties thereof is particularly effective in dispersion and is thus preferred herein. Nucleic acid molecules suitable for use in the present invention include but are not limited to those having the general formula:

1. $A_n$ wherein n=1-2000;
2. $T_n$ wherein n=1-2000;
3. $C_n$ wherein n=1-2000;
4. $G_n$ wherein n=1-2000;
5. $R_n$ wherein n=1-2000, and wherein R may be either A or G;
6. $Y_n$ wherein n=1-2000, and wherein Y may be either C or T;
7. $M_n$ wherein n=1-2000, and wherein M may be either A or C;
8. $K_n$ wherein n=1-2000, and wherein K may be either G or T;
9. $S_n$ wherein n=1-2000, and wherein S may be either C or G;
10. $W_n$ wherein n=1-2000, and wherein W may be either A or T;
11. $H_n$ wherein n=1-2000, and wherein H may be either A or C or T;
12. $B_n$ wherein n=1-2000, and wherein B may be either C or G or T;
13. $V_n$ wherein n=1-2000, and wherein V may be either A or C or G;
14. $D_n$ wherein n=1-2000, and wherein D may be either A or G or T; and
15. $N_n$ wherein n=1-2000, and wherein N may be either A or C or T or G;

In addition to the combinations listed above the person of skill in the art will recognize that any of these sequences may have one or more deoxyribonucleotides replaced by ribonucleotides (i.e., RNA or RNA/DNA hybrid) or one or more sugar-phosphate linkages replaced by peptide bonds (i.e. PNA or PNA/RNA/DNA hybrid).

Once the nucleic acid molecule has been prepared it may be stabilized in a suitable solution. It is preferred if the nucleic acid molecules are in a relaxed secondary conformation and only loosely associated with each other to allow for the greatest contact by individual strands with the carbon nanotubes. Stabilized solutions of nucleic acids are common and well known in the art (see Sambrook supra) and typically include salts and buffers such as sodium and potassium salts, and TRIS (Tris(2-aminoethyl)amine), HEPES (N-(2-hydroxyethyl)piperazine-N'-(2-ethanesulfonic acid), and MES(2-(N-Morpholino)ethanesulfonic acid. Preferred solvents for stabilized nucleic acid solutions are those that are water miscible where water is most preferred.

Once the nucleic acid molecules are stabilized in a suitable solution they may be contacted with a population of carbon nanotubes. It is preferred, although not necessary if the contacting is done in the presence of an agitation means of some sort. Typically the agitation means employs sonication for example, however may also include, devices that produce high shear mixing of the nucleic acids and nanotubes (i.e. homogenization), or any combination thereof. Upon agitation the carbon nanotubes will become dispersed and will form nanotube-nucleic acid complexes comprising at least one nucleic acid molecule loosely associated with the carbon nanotube by hydrogen bonding or some non-covalent means.

The process of agitation and dispersion may be improved with the optional addition of nucleic acid denaturing substances to the solution. Common denaturants include but are not limited to formamide, urea and guanidine. A non-limiting list of suitable denaturants may be found in Sambrook supra.

Additionally temperature during the contacting process will have an affect on the efficacy of the dispersion. Agitation at room temperature or higher was seen to give longer dispersion times whereas agitation at temperatures below room temperature (23° C.) were seen to give more rapid dispersion times where temperatures of about 4° C. are preferred.

By "electron acceptor", it is meant a molecule or group of atoms with a high electron affinity and with an ability to accept electrons under given reaction conditions. The electron acceptor can be inorganic metal complexes, organic molecules, and simple ions such as proton H+. General classes of suitable electron acceptors useful in the disclosed methods include pyridinium salts, viologens, arylpyrilium salts, nitro and dinitro aromatic compounds, cyano and polycyano aromatic compounds and mixtures thereof. Specific electron acceptors include, phenylnitrile, phenylenedinitrile(s), 2,4-dinitrofluorobenzene, tetracyanobenzene, and cyanoacetic acid, cyanoacetate lower alkyl esters, α-cyanoacetamide, α-cyanoacetanilide, malononitrile, nitroacetic acid, nitroacetate lower alkyl esters, dinitromethane, nitroacetone, nitrochloromethane, formyl acetic acid, formyl acetate lower alkyl esters, formyl acetone, acetyl acetone, malonate lower alkyl diesters, or acetoacetate lower alkyl esters. tetracyanoethylene, tetracyanoquinodimethane, benzoquinone, dichlorodicyanobenzoquinone, tetrachlorobenzoquinone, tetrafluorobenzoquinone, tetracyanobenzoquinone, tetracyanobenzene, hexacyanobenzene, picric acid, picryl chloride, trinitrobenzoic acid, trinitrobenzoate lower alkyl esters trinitroanisole, tri-nitrofluorenone, tetra-nitrofluorenone, tetranitrocarbazole, anthraquinone, and nitrobenzaldehyde. Also useful are the transition metal complexes of any of the above. Complexes of ruthenium (II) salts and particularly $Ru(2,2'-bipyridyl)_3^{2+}$ are useful for the processes described herein.

Also described herein is a photoelectrochemical cell comprising:
a) an anode; b) a cathode; and c) an electrolyte comprising:
 i) a transition metal complex having an absorption band with a maximum between 300 and 600 nm and an extinction coefficient more than about $10 \, M^{-1} \, cm^{-1}$
 ii) a population of carbon nanotubes dispersed in an aqueous containing medium.

Suitable transition metal complexes, and populations of carbon nanotubes are as described above.

Photochemical cells are well known in the art and are useful for many process, such as the production of electricity. For a discussion of the principles and construction of photochemical cells, see Wiley Encyclopedia of Electrical and Electronics Engineering, Solar Energy Conversion, Gaoling Zhao et al., 1999, John Wiley & Sons, Inc., DOI: 10.1002/047134608X.W3036 and Photochemical Technology, Survey, M. R. V. Sahyun, 1996, John Wiley & Sons, Inc., DOI: 10.1002/0471238961.1921182219010825.a01. The electrolyte can be any aqueous salt solutions with monovalent ions, such as but not limited to NaCl, $NaH_2PO_4$, and $Bu_4NBF_4$.

Also disclosed herein is a method for the oxidation of a carbon nanotube comprising: a) providing a set of redox reactants in close association with each other, the reactants consisting essentially of:

i) a transition metal complex having an absorption band with a maximum between 300 and 600 nm and an extinction coefficient more than about 10 $M^{-1}$ $cm^{-1}$;

ii) a population of carbon nanotubes dispersed in an aqueous containing medium; and iii) an electron acceptor;

b) irradiating the redox reactants of (a) with light comprising the absorption wavelength of the transition metal complex whereby the carbon nanotubes in the oxidation reactants are oxidized; and c) optionally recovering the oxidized carbon nanotubes.

For the purposes of this invention, "oxidized" refers to the state of a substance that has lost one or more negative charges in the form of electrons. "Reduced" refers to the state of a substance that has gained one or more negative charges in the form of electrons. A "redox" reaction refers to a reaction in which at least one substance is oxidized and at least one substance is reduced. "Oxidizing reagent" is defined as a substance that readily accepts electrons in a redox reaction. "Reducing reagent" is defined as a substance that readily donates electrons in a redox reaction. An "oxidizable compound" is a substance that can be oxidized by an oxidizing agent. A "reducible compound" is a substance that can be reduced by a reducing agent.

Suitable transition metal complexes, electron acceptors, aqueous media, and populations of carbon nanotubes are as described above.

By "redox reactants" it is meant that the components are able to participate in electron-transfer reaction between themselves, examples of can be found in many standard general chemistry textbooks. (For example, General Chemistry, by D. A. McQuarrie, P. A. Rock, W.H. Freeman and Company, New York) The electron acceptors listed hereinabove are also suitable as redox reactants.

By "in close association with each other" it is meant that components are close enough that electron-transfer reactions can take place before the photo-excited carbon nanotube relaxes to its ground state through non-productive pathways.

This method can be used to generate chemical fuel in the form of hydrogen or electricity as described later in this application.

Also disclosed herein is a method for the generation of hydrogen comprising: a) providing a set of oxidation reactants in close association with each other, the reactants consisting essentially of:

i) a transition metal complex having an absorption band with a maximum between 300 and 600 nm and an extinction coefficient more than about 10 $M^{-1}$ $cm^{-1}$;

ii) a population of carbon nanotubes dispersed in an aqueous containing medium at an acidic pH; and iii) an electron donor;

b) irradiating the oxidation reactants of (a) with light comprising the absorption wavelength of the transition metal complex whereby hydrogen is produced; and c) optionally recovering the hydrogen.

By "acidic pH" it is meant a pH of less than 7. In one embodiment the acidic pH is in a range from about 6 to about 1.

By "electron donor", it is meant a molecule or group of atoms with a high electron affinity and with an ability to donate electrons under given reaction conditions. Suitable electron donors include but are not limited to hydrazine, 2,2'-azino-bis(3-ethylbenzthiazoline-6-sulphonic acid) (ABTS), o-tolidine dihydrochloride, violuric acid, 3-hydroxyanthranilic acid, sodium 3-hydroxy-4-nitrosonaphthalene-2,7-disulfonate (NNS), promazine, squaric acid, H2O, H2O2, H2S, I—, ascorbic acid (vitamin C), glutathione, 2-mercaptoethanol, dithiothreitol, sodium dithionite, nicotinamide adenine dinucleotide (NADH), nicotinamide adenine dinucleotide phosphate (NADPH).

Suitable transition metal complexes, electron acceptors, aqueous media, and populations of carbon nanotubes are as described above.

Figure 3:
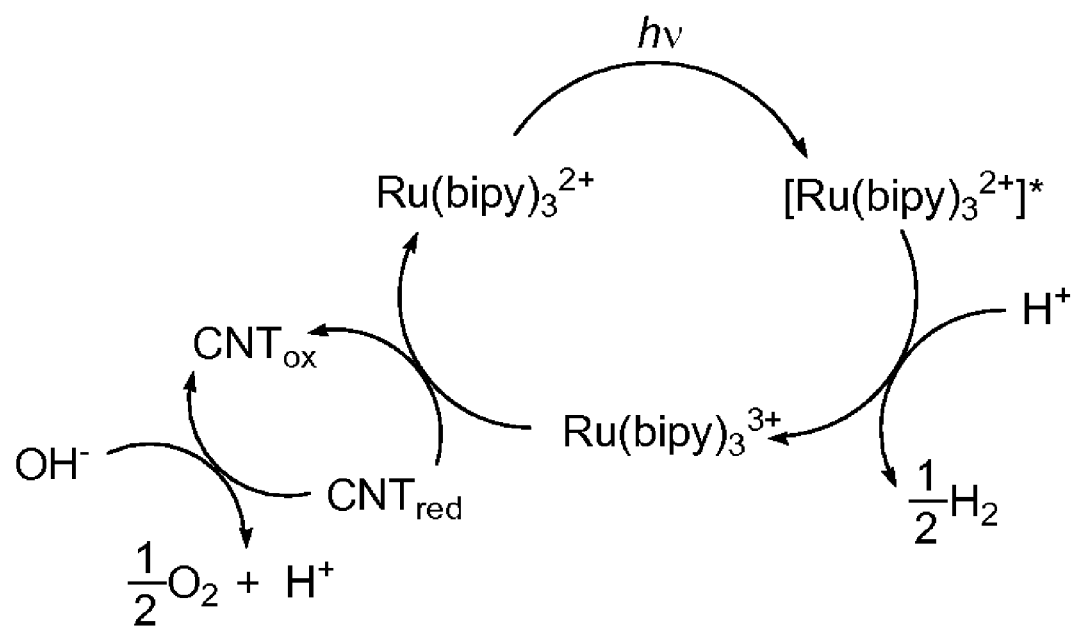
FIG. 3 is a diagram outlining a cycle for the generation of hydrogen utilizing a population of carbon nanotubes and a transition metal complex.

Although not wishing to be bound by theory, it is believed that hydrogen is generated in the above method by the cycle shown in FIG. 3, wherein hv is light as defined above, $CNT_{ox}$ indicates an oxidized carbon nanotube, $CNT_{red}$ indicates a reduced carbon nanotube, $Ru(bipy)_3^{2+}$ and (bipy=2,2'-bipyridyl) $Ru(bipy)_3^{3+}$ are illustrative of a suitable transition metal complex as defined above, $[Ru(bipy)_3^{2+}]^*$ is illustrative of a suitable transition metal complex in the excited state, and OH— is illustrative of a suitable electron donor.

Also disclosed herein is an apparatus to generate hydrogen, comprising: a) an anode; b) a cathode; and c) an electrolyte comprising:

i) a transition metal complex having an absorption band with a maximum between 300 and 600 nm and an extinction coefficient more than about 10 $M^{-1}$ $cm^{-1}$;

ii) a population of carbon nanotubes dispersed in an aqueous containing medium at acidic pH; and iii) an electron donor.

EXAMPLES

The present invention is further defined in the following Examples. It should be understood that these Examples, while indicating preferred embodiments of the invention, are given by way of illustration only. From the above discussion and these Examples, one skilled in the art can ascertain the essential characteristics of this invention, and without departing from the spirit and scope thereof, can make various changes and modifications of the invention to adapt it to various uses and conditions.

General Methods

The photooxidations were followed by UV-Vis spectroscopy at 990 nm. DNA-CNT hybridized samples were prepared as described in U.S. Patent Applic. 2005-0009039 and in Huang et al. (Anal. Chem. 77, 6225, 2005) using (G/T)90 single stranded DNA, where G/T stands for a random mix of G and T, the total length is 90 bases. Typical concentration used was 5 ug/ml (OD=1). Irradiation was carried out using a light source at 366 nm from a hand-held UV source (UVP, 6W, Upland, Calif.).

Example 1

Photooxidation of Carbon Nanotubes at pH=3

A solution of DNA-CNT hybrids and 10 uM $Ru(bipy)_3Cl_2$ (bipy=2,2'-bipyridyl) in water, containing a 10 mM sodium phosphate pH 3 buffer was placed into a cuvette and irradiated for 3 minutes. The observed optical density of the sample at 990 nm decreased from 1.1 units to 0.85 units after irradiation. In contrast, intensity of the peak at 990 nm did not change when ruthenium salt was omitted. FIG. 1 shows the changes in intensity fluorescence intensity for the pH 3 sample at various irradiation times versus a control sample.

Example 2

Photooxidation at Various pH

The reaction was monitored by fluorescence spectroscopy at 1043 nm (excitation wavelength is 688 nm). A series of solutions with 5 μg/ml DNA-CNT hybrids and 10 μM Ru(bipy)$_3$Cl$_2$ were prepared at pH 3, 7 and 11. The samples were irradiated for 2 minutes at 366 nm. Fluorescence intensity was recorded before and after irradiation. At pH 3, intensity decreased significantly from $5.2 \times 10^{-7}$ mW/cm$^2$ to $2.13 \times 10^{-7}$ mW/cm$^2$, whereas samples at pH 7 and 11 showed insignificant changes from $6.11 \times 10^{-7}$ mW/cm$^2$ to $6.55 \times 10^{-7}$ mW/cm$^2$ and from $7.93 \times 10^{-7}$ mW/cm$^2$ to $7.71 \times 10^{-7}$ mW/cm$^2$, respectively.

Example 3

Photooxidation at Various Concentrations of Ru(bipy)$_3$Cl$_2$

Figure 2:
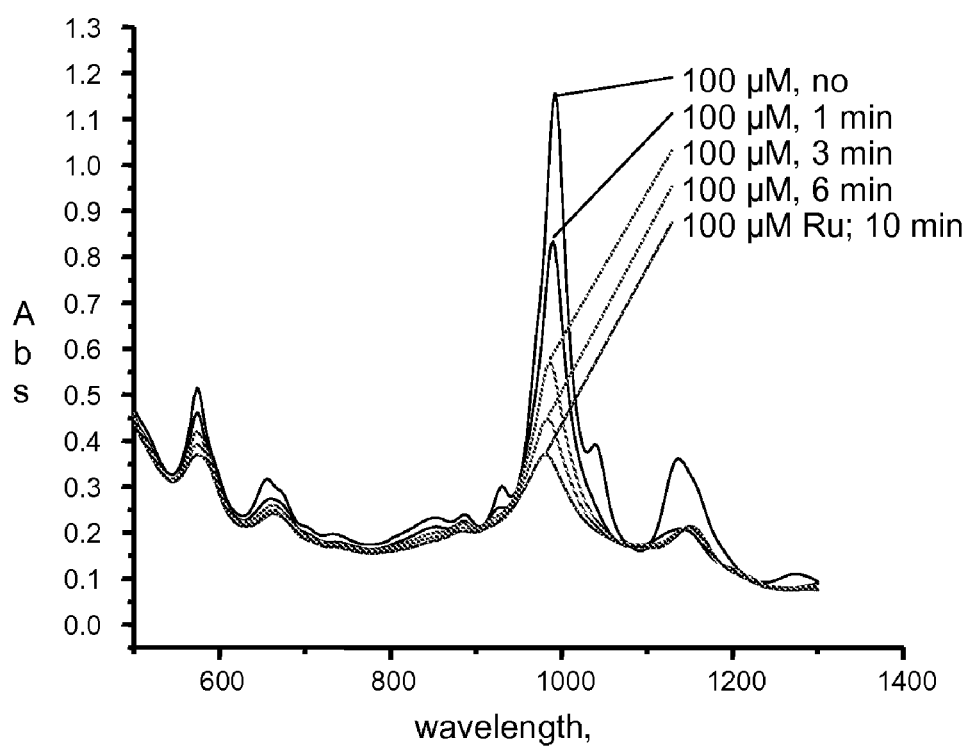
FIG. 2 is a graph showing the change in fluorescence intensity after irradiation with UV of the 100 μM Ru(bipy)$_3$Cl$_2$ DNA/CNT hybrid.

A series of solutions with CNT/DNA hybrids at 5 μg/ml and Ru(bipy)$_3$Cl$_2$ at 10, 50 and 100 μM were prepared at pH 3. The samples were irradiated for several minutes and changes in intensity of the peak at 990 nm in UV-Vis spectra were recorded. With 10 μM Ru(bipy)$_3$Cl$_2$, OD at 990 nm decreased by 21% after ten minutes of irradiation. The change in peak intensity was even more pronounced at 50 and 100 μM Ru(bipy)$_3$Cl$_2$: 56% and 70%, respectively, as shown in FIG. 2.

What is claimed is:

1. A photochemical cell comprising:
   a) an anode;
   b) a cathode; and
   c) an electrolyte comprising:
      i) a transition metal complex having an absorption band with a maximum between 300 and 600 nm and an extinction coefficient more than about 10 M$^{-1}$ cm$^{-1}$; and
      ii) a population of carbon nanotubes dispersed in an aqueous containing medium.

2. The photochemical cell according to claim 1 wherein the transition metal complex is comprised of Ru, Os or Fe.

3. The photochemical cell according to claim 1 wherein the transition metal complex is comprised of optionally substituted polypyridyl ligands.

4. The photochemical cell according to claim 1 wherein the population of carbon nanotubes is dispersed by a charged dispersant.

5. The photochemical cell according to claim 4 wherein the charged dispersant is a polymer.

6. The photochemical cell according to claim 5 wherein the polymer is selected from the group consisting of nucleic acids, polypeptides, and peptide nucleic acids.

7. The photochemical cell according to claim 1 wherein the dispersed carbon nanotubes are single walled nanotubes.

8. The photochemical cell according to claim 1 wherein the aqueous containing medium is selected from the group consisting of a solution, a gel and a film.

9. An apparatus to generate hydrogen, comprising:
   a) an anode;
   b) a cathode; and
   c) an electrolyte comprising:
      i) a transition metal complex having an absorption band with a maximum between 300 and 600 nm and an extinction coefficient more than about 10 M$^{-1}$ cm$^{-1}$;
      ii) a population of carbon nanotubes dispersed in an aqueous containing medium at acidic pH; and
      iii) an electron donor.

10. The apparatus according to claim 9 wherein the transition metal complex is comprised of Ru, Os or Fe.

11. The apparatus according to claim 9 wherein the transition metal complex is comprised of optionally substituted polypyridyl ligands.

12. The apparatus according to claim 9 wherein the electron donor is one or more of hydrazine, 2,2'-azino-bis(3-ethylbenzthiazoline-6-sulphonic acid) (ABTS), o-tolidine dihydrochloride, violuric acid, 3-hydroxyanthranilic acid, sodium 3-hydroxy-4-nitrosonaphthalene-2,7-disulfonate (NNS), promazine, squaric acid, H$_2$O, H$_2$O$_2$, H$_2$S, I$^-$, ascorbic acid, glutathione, 2-mercaptoethanol, dithiothreitol, sodium dithionite, nicotinamide adenine dinucleotide, or nicotinamide adenine dinucleotide phosphate.

13. The apparatus according to claim 9 wherein the population of carbon nanotubes is dispersed by a charged dispersant.

14. The apparatus according to claim 13 wherein the charged dispersant is a polymer.

15. The apparatus according to claim 14 wherein the polymer is selected from the group consisting of nucleic acids, polypeptides, and peptide nucleic acids.

16. The apparatus according to claim 9 wherein the dispersed carbon nanotubes are single walled nanotubes.

17. The apparatus according to claim 9 wherein the aqueous containing medium is selected from the group consisting of a solution, a gel and a film.

18. The apparatus according to claim 9 wherein the aqueous containing medium is at pH of about 1 to about 6.

* * * * *